United States Patent [19]

Watanabe et al.

[11] 4,389,539
[45] Jun. 21, 1983

[54] DIGITAL FILTER FOR PERFORMING SERIAL OPERATIONS AND VOCAL SOUND SYNTHESIZING APPARATUS HAVING THE DIGITAL FILTER

[75] Inventors: Taisuke Watanabe; Katsuyuki Niyada, both of Sagamihara; Shoji Hiraoka; Kenji Kaga, both of Kawasaki, all of Japan

[73] Assignee: Matsushita Electric Industrial Company, Ltd., Osaka, Japan

[21] Appl. No.: 242,191

[22] Filed: Mar. 10, 1981

[30] Foreign Application Priority Data

Mar. 12, 1980 [JP] Japan .................................. 55-31797

[51] Int. Cl.³ .............................................. G10L 1/00
[52] U.S. Cl. .................................................. 179/1 SM
[58] Field of Search .............. 179/1 SM, 1 SG, 1 SA, 179/15.55 R, 15.55 T; 364/513, 724

[56] References Cited

U.S. PATENT DOCUMENTS 4,052,563 10/1977 Noda et al. .................. 179/15.55 R
4,209,844 6/1980 Brantingham et al. .......... 179/1 SM Primary Examiner—Emanuel S. Kemeny
Attorney, Agent, or Firm—Pollock, VandeSande & Priddy

[57] ABSTRACT

A single section digital filter is provided with a digital input signal and includes a serial multiplier having an input responsive to predetermine parameters. An adder/subtractor has an input serially connected to the multiplier output. A first switch serially selects recirculating data from an adder/subtractor output directly or delayed, or the digital input signal. A second input of the multiplier is serially provided with the selected data. A second switch serially and selectively connects delayed selected data to a second input of the adder/subtractor. A latch serially receives delayed data for effecting series/parallel conversion thereof.

7 Claims, 6 Drawing Figures

FIG. 4

| T CLOCK | 1 | | | | | | | | | | | | | | | | | | | | | 2 | | | | | | | |
|---|---|---|---|---|---|---|---|---|---|---|---|---|---|---|---|---|---|---|---|---|---|---|---|---|---|---|---|---|---|
| S CLOCK | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 1 | 2 | 3 | 4 | 5 | 6 | 7 |
| MULTIPLIER INPUT DATA | $d_0$ | $d_1$ | $d_2$ | $d_3$ | $d_4$ | $d_5$ | $d_6$ | $d_7$ | $d_8$ | $d_9$ | $d_{10}$ | $d_{11}$ | $d_{12}$ | $d_{13}$ | $d_{14}$ | $d_{15}$ = D | | | | | | | | | | | | | |
| MULTIPLIER OUTPUT DATA | | | | | | | | | | | | | | | | | | DXK = $P_0$ | $P_1$ | | | | $P_2$ | $P_3$ | $P_4$ | $P_5$ | $P_6$ | $P_7$ | $P_8$ |
| ADD/SUB INPUT DATA | | | | | | | | | | | | | | | | | | | | E = | $e_0$ | | $e_1$ | $e_2$ | $e_3$ | $e_4$ | $e_5$ | $e_6$ | $e_7$ |
| ADD/SUB OUTPUT DATA | | | | | | | | | | | | | | | | | | | | | | F = E ± DXK = | $f_0$ | $f_1$ | $f_2$ | $f_3$ | $f_4$ | $f_5$ | $f_6$ |

FIG. 5

DIGITAL FILTER FOR PERFORMING SERIAL OPERATIONS AND VOCAL SOUND SYNTHESIZING APPARATUS HAVING THE DIGITAL FILTER

FIELD OF THE INVENTION

This invention generally relates to a digital filter, which is used for synthesizing vocal sounds by a linear prediction coding technique, and more particularly, the present invention relates to such a digital filter for effecting various operations, such as multiplication of input data having a plurality of bits by a plurality of parameters each having a plurality of bits.

In apparatus for synthesizing vocal sounds, vocal sound waves are digitized so the apparatus may sample the waveform for a very short period so that parameters for reproducing the vocal sound waves by synthesizing sound wave signals are extracted in accordance with linear prediction coding techniques as disclosed in a Japanese Patent Publication (after examination) 49-18007. Then the parameters are used in a lattice filter to effect inverse conversion to synthesize sound waves by filtering sound waves from given vocal sound sources, so that synthesized vocal sounds will be finally emitted.

In such a digital lattice filter, digital data in the form of bits are processed to perform addition and subtraction and to transfer the same simultaneously. Namely, all the bits of a data word are processed in parallel. For instance, in conventional array multipliers, bits of data are simultaneously processed in parallel. Assuming that a data word consisting of 16 bits is multiplied by another data word consisting of 16 bits, each bit of the former data word is multiplied by each bit of the latter data word so that bits of corresponding positions in both data words are multiplied. Although the architecture of such a conventional digital filter has been developed so that the number of elements for constituting the digital filter is the minimum, the number of elements is still great, having a complex construction, and therefore, when such a digital filter is provided in the form of an integrated circuit, the area occupied by the digital filter is large. Accordingly, such a large area in an integrated circuit has resulted in a high cost in manufacturing an integrated circuit of a digital filter. Moreover, because of such a complex structure and large occupying area, freedom in designing a digital filter integrated circuit has been limited hitherto.

SUMMARY OF THE INVENTION

The present invention has been developed in order to eliminate the above-mentioned disadvantage and drawback inherent to the conventional digital filters used in an apparatus for synthesizing vocal sounds.

It is, therefore, a primary object of the present invention to provide a new and useful digital filter which is small in size when actualized in the form of an integrated circuit.

Another object of the present invention is to provide a digital filter which is simple in construction.

A further object of the present invention is to provide a digital filter which provides freedom in designing an integrated circuit thereof.

The structure for accomplishing the aims of the present invention is directed to a single section digital filter, which is provided with a digital input signal and includes a serial multiplier having an input responsive to predetermine parameters. An adder/subtractor has an input serially connected to the multiplier output. A first switch serially selects recirculating data from an adder/subtractor output directly or delayed, or the digital input signal. A second input of the multiplier is serially provided with the selected data. A second switch serially and selectively connects delayed selected data to a second input of the adder/subtractor. A latch serially receives delayed data for effecting series/parallel conversion thereof.

BRIEF DESCRIPTION OF THE DRAWINGS

These and other objects and features of the present invention will become more readily apparent from the following detailed description of the preferred embodiments taken in conjunction with the accompanying drawings in which:

FIG. 4 is a timing chart showing the basic operation expressed in terms of $E \pm D \times K$ in the lattice digital filter of FIG. 2 or FIG. 3;

FIG. 5 is a chart showing the timing and way of operations in the multiplier of FIG. 2 or FIG. 3.

DETAILED DESCRIPTION OF THE PREFERRED EMBODIMENTS

Figure 1:
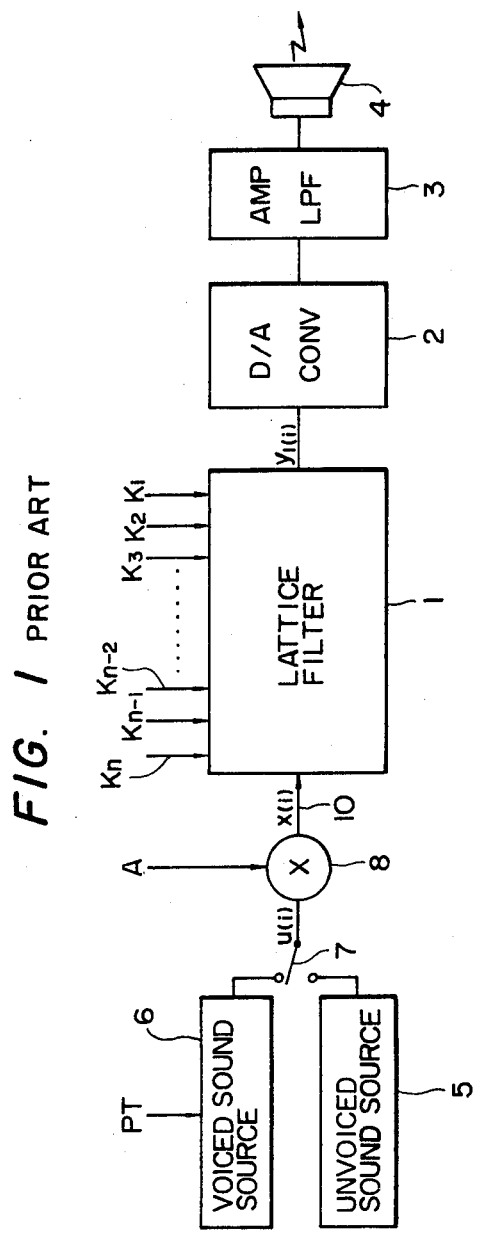
FIG. 1 is a view showing a basic structure of apparatus for synthesizing vocal sounds, which apparatus includes a digital filter.

FIG. 1 illustrates a block diagram of apparatus for synthesizing vocal sounds, showing the fundamental structure thereof. The apparatus for synthesizing vocal sounds comprises a multi-row lattice filter 1 for digitally filtering an input signal 10, i.e. an exciting signal, by using a plurality of filter factors $K_1$ to $K_n$, i.e. parameters which have been obtained by analyzing human's voice sounds. The output signal of the filter 1 is fed to a digital-to-analog (D/A) converter 2 to be converted into an analog signal. The output signal of the D/A converter 2 is fed to a combination of an amplifier and a low pass filter 3 so that the analog signal from the D/A converter 2 is amplified while sampling noises due to digital processing are eliminated to drive a speaker 4. The speaker 4 thus emits desired vocal sounds.

The exciting signal 10 is supplied from either a voiced sound source 6 or a unvoiced sound source 5. Namely, one of the output signals of the sound sources 5 and 6 is selected by a digital switch 7. When it is intended to select a voiced sound, such as "b", "v" or "z", pronounced by vibrating the vocal cords, the voiced sound source 6 is used. On the contrary, when it is intended to select a unvoiced sound, such as "p", "f" and "s", pronounced by forwarding air to the sound canal without vibrating the sound cords, the unvoiced sound source 5 is used. A signal PT indicative of pitch of the voiced sound is applied to the voiced sound source 6 so that the vibrating frequency of the vocal sound signal from the voiced sound source 6 is controlled by the signal PT.

The unvoiced sound source 5 comprises a digital signal generator which emits a random signal.

The output signals of the voiced sound source 6 and the unvoiced sound source 5 have constant levels when viewed periodically. Therefore, in order to give stress to the sound signals from these sound sources 5 and 6, one of the output signal of the sound sources 5 and 6 is multiplied by an amplitude parameter A in a multiplier 8. Namely, the apparatus for synthesizing sounds of FIG. 1 is a system for generating vocal sound waves by applying thereto the pitch PT, the amplitude A and the lattice filter factors $K_1$ to $K_n$, which are all parameters of vocal sounds.

In the example of FIG. 1, the speed of data transfer to the D/A converter 3 is selected to be 10 KHz, and therefore, the upper limit of the frequency of sound waves emitted from the speaker 4 is 5 KHz.

Next, the method of operations in the lattice filter 1, which is the subject matter of the present invention, will be described. In FIG. 1, it is assumed that A and $K_1$ to $K_n$ are applied one after another in a sequence. The number of parameters K is assumed to be ten, namely, n = 10. The relationship between an input signal $u(i)$, i.e. the input signal of the multiplier 8, and the output signal $y_n(i)$ of respective rows of the lattice filter 1 is as follows:

$$x(i) = u(i) \times A \quad (1)$$

$$y_n(i) = y_{n+1}(i) + K_n \cdot b_n(i-1) \; (n = 1 \text{ to } 10) \quad (2)$$

$$b_{n+1} = b_n(i-1) - K_n \cdot y_n(i) \; (n = 1 \text{ to } 9) \quad (3)$$

$$y_1(i) = b_1(i) \quad (4)$$

$$y_{11}(i) = x(i) \quad (5)$$

wherein "i" indicates the sampling period at a frequency of 10 KHz;

"$b_n y_n$" indicates an intermediate result at an $n^{th}$ row.

The operations of the formulas (1) to (5) are executed by performing multiplications twenty times and addition/subtraction nineteen times at an interval governed by a 10 KHz sampling rate to obtain an output signal. In order to execute these operations by a single multiplier and a single adder/subtractor, the sampling timing of 10 KHz is divided by twenty, and these timings are referred to as $T_1$ to $T_{20}$.

According to the present operating technique, operations are performed at a timing of a single T with respect to the value of "n" of the formula (2) or (3), while "y" and "b" are alternately operated respectively from n=10 for "y" and from n=9 for "b". The above-mentioned operating technique is shown in the form of a block diagram of FIG. 2. The following TABLE I shows input and output data of respective elements of FIG. 2 for respective timings T. The block diagram of FIG. 2 corresponds to the combination of the multiplier 8 and the filter 1 illustrated in FIG. 1.

TABLE I

| TIMING | MULTIPLIER FIRST INPUT | MULTIPLIER SECOND INPUT | ADDER/SUBTRACTOR +/− | ADDER/SUBTRACTOR SECOND INPUT | ADDER/SUBTRACTOR OUTPUT | SHIFT REGISTER 24 INPUT | NINTH ROW OUTPUT | TENTH ROW OUTPUT | ELEVENTH ROW OUTPUT | LATCH OUTPUT |
|---|---|---|---|---|---|---|---|---|---|---|
| $T_1$ | $k_1$ | $b_1(i-2)$ | + | $y_2(i-1)$ | $b_3(i-1)$ | $b_3(i-1)$ | | | $y_1(i-2)$ | $y_1(i-2)$ |
| $T_2$ | $k_1$ | $y_1(i-1)$ | − | $b_1(1-2)$ | $y_1(i-1)$ | $y_1(i-1)$ | | | | ↓ |
| $T_3$ | A | $u(i)$ | + | 0 | $b_2(i-1)$ | $b_2(i-1)$ | | | | ↓ |
| $T_4$ | $k_{10}$ | $b_{10}(i-1)$ | + | $X(i)$ | $X(i)$ | $X(i)$ | | $b_{10}(i-1)$ | | ↓ |
| $T_5$ | $k_9$ | $b_9(i-1)$ | + | $y_{10}(i)$ | $y_{10}(i)$ | $y_{10}(i)$ | | $b_9(i-1)$ | | ↓ |
| $T_6$ | $k_9$ | $y_9(i)$ | − | $b_9(i-1)$ | $y_9(i)$ | | | | | ↓ |
| $T_7$ | $k_8$ | $b_8(i-1)$ | + | $y_9(i)$ | $b_{10}(i)$ | $b_{10}(i)$ | | $b_8(i-1)$ | | ↓ |
| $T_8$ | $k_8$ | $y_8(i)$ | − | $b_8(i-1)$ | $y_8(i)$ | | | | | ↓ |
| $T_9$ | $k_7$ | $b_7(i-1)$ | − | $y_8(i)$ | $b_9(i)$ | $b_9(i)$ | | $b_7(i-1)$ | | ↓ |
| $T_{10}$ | $k_7$ | $y_7(i)$ | − | $b_7(i-1)$ | $y_7(i)$ | | | | | ↓ |
| $T_{11}$ | $k_6$ | $b_6(i-1)$ | + | $y_7(i)$ | $b_8(i)$ | $b_8(i)$ | | $b_6(i-1)$ | | ↓ |
| $T_{12}$ | $k_6$ | $y_6(i)$ | − | $b_6(i-1)$ | $y_6(i)$ | | | | | ↓ |
| $T_{13}$ | $k_5$ | $b_5(i-1)$ | + | $y_6(i)$ | $b_7(i)$ | $b_7(i)$ | | $b_5(i-1)$ | | ↓ |
| $T_{14}$ | $k_5$ | $y_5(i)$ | − | $b_5(i-1)$ | $y_5(i)$ | | | | | ↓ |
| $T_{15}$ | $k_4$ | $b_4(i-1)$ | + | $y_5(i)$ | $b_6(i)$ | $b_6(i)$ | | $b_4(i-1)$ | | ↓ |
| $T_{16}$ | $k_4$ | $y_4(i)$ | − | $b_4(i-1)$ | $y_4(i)$ | | | | | ↓ |
| $T_{17}$ | $k_3$ | $b_3(i-1)$ | + | $y_4(i)$ | $b_5(i)$ | $b_5(i)$ | | $b_3(i-1)$ | | ↓ |
| $T_{18}$ | $k_3$ | $y_3(i)$ | − | $b_3(i-1)$ | $y_3(i)$ | | | | | ↓ |
| $T_{19}$ | $k_2$ | $b_2(i-1)$ | + | $y_3(i)$ | $b_4(i)$ | $b_4(i)$ | $b_2(i-1)$ | | | ↓ |
| $T_{20}$ | $k_2$ | $y_2(i)$ | − | $b_2(i-1)$ | $y_2(i)$ | | | | | $y_1(i-2)$ |
| $T_1$ | $k_1$ | $b_1(i-1)$ | + | $y_2(i)$ | $b_3(i)$ | $b_3(i)$ | | | $y_1(i-1)$ ‖ $b_1(i-1)$ | $y_1(i-1)$ |

Figure 2:
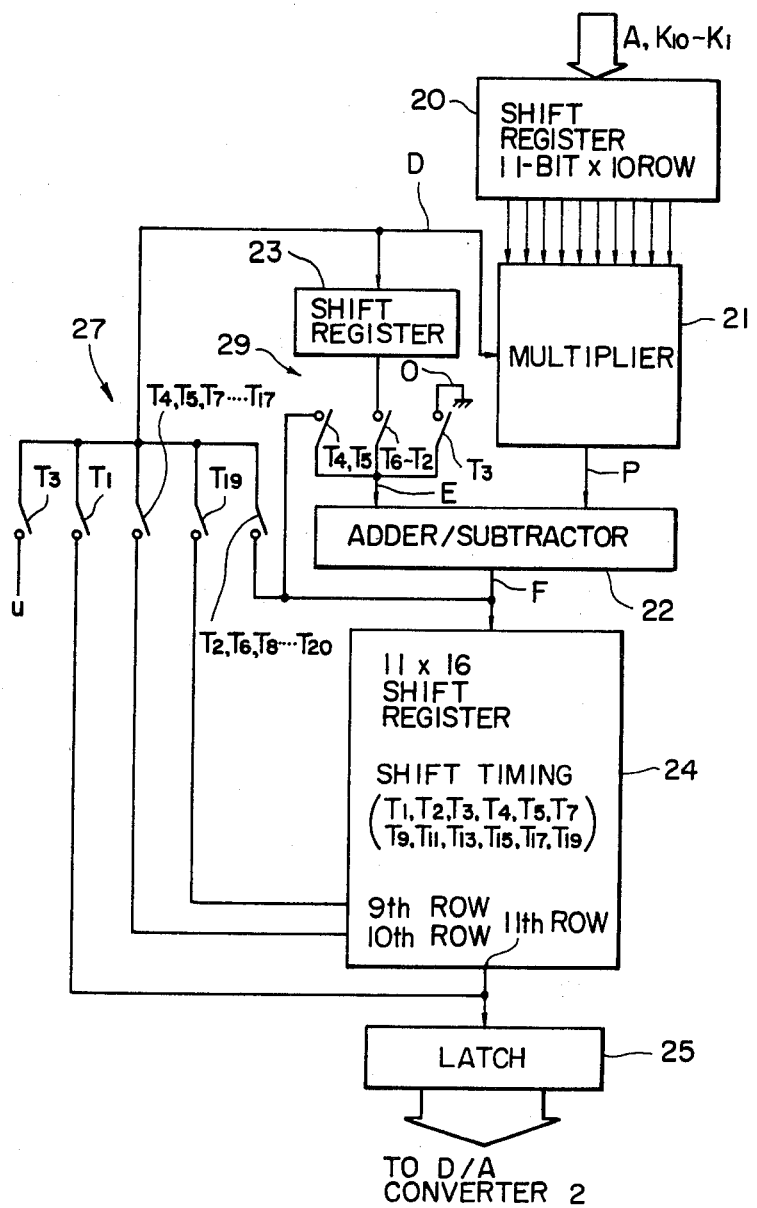
FIG. 2 is a schematic block diagram of an embodiment of the improved digital filter according to the present invention.

In FIG. 2, a shift register 20 of 11 bits × 10 rows is provided for storing eleven data A and $K_1$ to $K_n$ which are applied thereto as the above-mentioned amplitude parameter and the filter factors. These data or parameters A and $K_1$ to $K_{10}$ vary in a sequence at an interval of 2.5 microseconds in synchronism with a clock pulse signal (not shown). The data A and $K_1$ to $K_{10}$ are applied to respective rows of the shift register 20 in parallel, and the eleven bits in each row are shifted one by one in a given direction so that ten bits are emitted as output data from one end of each of the rows in a sequence. As illustrated in FIG. 2, the shift register 20 has ten output terminals for forwarding the ten bits of the output data to a first input, which has ten input terminals, of a multiplier 21. Namely, as shown in TABLE I, the contents of respective rows of the shift register 20 are shifted at a timing of T to be applied to the multiplier in parallel one after another. The multiplier 21 performs multiplication so that each of the parameters A and $K_1$ to $K_{10}$ is multiplied by the data $y_n$ or $b_n$ selected by a selector 27 as shown in TABLE I.

The data selected by the selector 27 are supplied to the multiplier 21 serially from the least significant bit (LSB) of the data, and thus multiplication is performed. The result of the multiplication is fed to a first input of an adder/subtractor 22. The adder/subtractor 22 has a second input responsive to an output signal of another selector 29 which selects one of an output signal of a shift register 23, a signal indicative of zero and a signal indicative of the result of addition/subtraction effected by the adder/subtractor 22. The shift register 23 is responsive to the output signal of the first mentioned selector 27 so that the same data fed to the multiplier 23 from the selector 27 is retarded by an interval of timing T to be supplied to the selector 29. The output signal of the selector 29, i.e. a second input signal of the adder/subtractor 22 is also a serial data.

Accordingly, the adder/subtractor 22 performs addition/subtraction between the serial data, so that the adder/subtractor 22 is constructed of a full adder of one bit. Data operations are performed in the multiplier 21 and the adder/subtractor 22 within a single timing of T.

A shift register 24, which follows the adder/subtractor 22 is constructed of 11×16 shifters, and is used for storing values of $b_n(i)$. As will be understood from formulas (2) and (3), the stored data $b_n(i)$ are used for operating a subsequent output signal $y_1(i+1)$. The output signal of the shift register 24 is serially fed to a latch 25, in which the serially applied data are temporarily stored, so that a parallel output of the latch 25 will be converted from digital to analog to become output vocal sound waves in the D/A converter 2 of FIG. 1. All the operated data are transferred serially from one block to another as illustrated in FIG. 2. The accuracy of data in operation is of 16-bit, while arithmetical operations of data are performed as a value of 2s complement.

TABLE I shows input and output data at timings of T. In an interval of a timing $T_3$, $u(i)$ is multiplied by A, and zero is added to the result of multiplication, and then the result of the operation will be emitted at a subsequent timing of $T_4$. In the interval of the timing $T_4$, an output $b_{10}(i-1)$ of a tenth row of the shift register 24 is multiplied by $K_{10}$, and the result of the multiplication is added to the output of the adder/subtractor 22, and thus an output represented by $y_{10}(i)=x(i)+K_{10}\times b_{10}(i-1)$ is emitted from the adder/subtractor 22 at the timing of $T_5$. In the interval of the timing $T_5$, an output $b_9(i-1)$ of the tenth row of the shift register 24 is multiplied by $K_9$, and the result of the multiplication is added to the result from the adder/subtractor 22 to emit an output signal $y_9(i)=y_{10}(i)+K_9\times b_9(i-1)$ from the adder/subtractor 22 at the timing of $T_6$. In the interval of the timing $T_6$, the result $y_9$ from the adder/subtractor 22 is multiplied by $K_9$, and the result of the multiplication is subtracted from an output signal $b_9(i-1)$ of the shift register 23 in the adder/subtractor 22 to emit an output represented by $b_{10}(i)=b_9(i-1)-K_9\times y_9(i)$. In this way, operations are executed in a sequence with each timing of T so that output data will be obtained at the output of the latch 25 at the timing of $T_1$.

Accordingly, the selector 29 selects the output signal of the adder/subtractor 22 at the timing of $T_4$ and $T_5$; the output signal of the shift register 23 during a period of time from $T_6$ to $T_2$; and zero output at the timing of $T_3$. On the other hand, the other selector 27 selects the vocal sound wave signal $u(i)$ from one of the sound sources 5 and 6 at the timing of $T_3$; an output $y_1(i-2)=b_1(i-2)$ of the eleventh row of the shift register 24 at the timing of $T_1$; outputs $b_{10}$, $b_9$, $b_8$, $b_7$, $b_6$, $b_5$, $b_4$ and $b_3$ respectively at the timings of $T_4$, $T_5$, $T_7$, $T_9$, $T_{11}$, $T_{13}$, $T_{15}$, $T_{17}$; an output $b_2$ of the ninth row of the shift register 24 at the timing $T_{19}$; and outputs $y_1$, $y_9$, $y_8$, $y_7$, $y_6$, $y_5$, $y_4$, $y_3$ and $y_2$ of the adder/subtractor 22 at the timings of $T_2$, $T_6$, $T_8$, $T_{10}$, $T_{12}$, $T_{14}$, $T_{16}$, $T_{18}$ and $T_{20}$.

From the above, it will be understood that the shift registers 23 and 24 respectively function as delay circuits, while the latch 25 functions as a serial-to-parallel converter.

The above-described lattice digital filter has advantages as follows because data operations are performed serially.

(1) Since only a single line is required between each element (the multiplier 21, the adder/subtractor 22, the shift registers 23 and 24, and the latch 25) for forwarding data, the arrangement according to the present invention is advantageous as to the area occupied by an integrated circuit compared to the conventional arrangement which requires sixteen lines for transferring data in parallel from one element to another.

(2) The multiplier 21 can be constructed of ten 1-bit full adders, while the adder/subtractor 22 can be constructed of a single 1bit full adder according to the present invention. This means the number of 1-bit full adders can be reduced to one tenth to one sixteenth of the number of full adders required in the conventional arrangement.

Although the arrangement according to the present invention has the above-mentioned advantages, the maximum frequency of clock pulses for further dividing each interval of T into twenty-two timings is required to be 4.4 MHz so that the above-described serial operations can be actualized as will be described in detail hereinafter. The above-mentioned further divided timings will be referred to as $S_1$, $S_2$, ... $S_{22}$.

Figure 3:
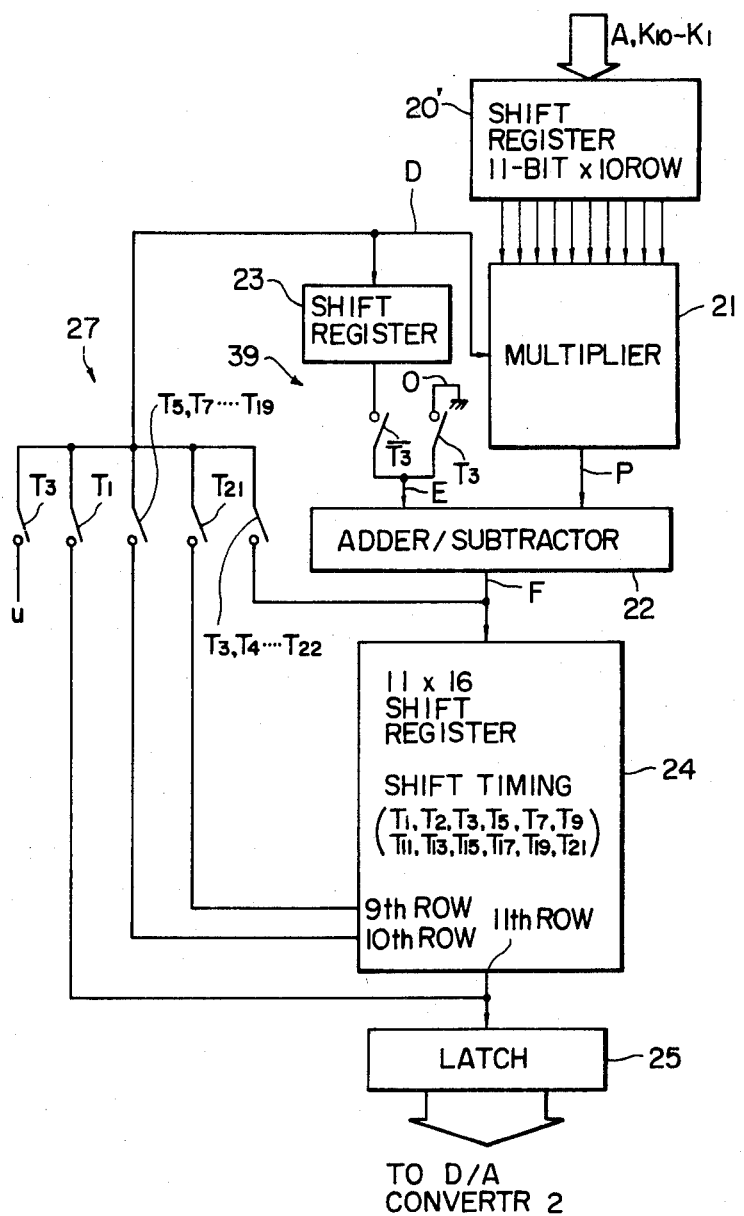
FIG. 3 is a schematic block diagram of another embodiment of the digital filter according to the present invention.

Furthermore, when each interval of T is divided into twenty-two timings $S_1$ to $S_{22}$, the arrangement of the selector 29 of FIG. 2 may be substituted with a simple arrangement of a selector 39 of FIG. 3, while the number of data buses can be reduced as shown in FIG. 3. Namely, the arrangement of FIG. 3, which shows a schematic block diagram of a second embodiment of the digital filter according to the present invention, is simpler in construction than that of FIG. 2, thus the arrangement of FIG. 3 is more advantageous for reducing the area on an integrated circuit, such as an LSI circuit.

The arrangement of FIG. 3 is the same as that of FIG. 2 except that a selector 39, which corresponds to the selector 29 of FIG. 2, is not responsive to the output data of the adder/subtractor 22. Remaining arrangements are the same as those of FIG. 2, and therefore, the same elements are designated at like numerals. A shift register 20', which corresponds to the shift register 20 of FIG. 2, has 11 bits ×10 rows in the same manner as the shift register 20 of FIG. 2, but a shiftclock applied thereto is different from that of the first embodiment. Namely, as seen in TABLE II, which shows the operation of the digital filter of FIG. 3, shift is effected at odd numbers of T (see the column of the first input of the multiplier of TABLE II). Therefore, shifting operation is simpler than in the first embodiment of FIG. 2

TABLE II

| TIMING | MULTIPLIER FIRST INPUT | MULTIPLIER SECOND INPUT | ADDER/SUBTRACTOR 22 SECOND INPUT | ADDER/SUBTRACTOR 22 OUTPUT | SHIFT REGISTER 24 INPUT | SHIFT REGISTER 24 NINTH ROW OUTPUT | SHIFT REGISTER 24 TENTH ROW OUTPUT | SHIFT REGISTER 24 ELEVENTH ROW OUTPUT | LATCH OUTPUT |
|---|---|---|---|---|---|---|---|---|---|
| $T_1$ | $k_1$ | $b_1(i-2)$ | $+y_2(i-1)$ | $b_3(i-1)=b_2(i-2)-k_2 \cdot y_2(i-1)$ | $b_3(i-1)$ | | | $y_1(i-2)$ $\parallel$ $b_1(i-2)$ | $y_1(i-2)$ |
| $T_2$ | $k_1$ | $y_1(i-1)$ | $-b_1(i-2)$ | $y_1(i-1)=y_2(i-1)+k_1 \cdot b_1(i-2)$ | $y_1(i-1)$ | | | | ↓ |
| $T_3$ | A | $u(i)$ | $+0$ | $b_2(i-1)=b_1(i-2)-k_1 \cdot y_1(i-1)$ | $b_2(i-1)$ | | | | ↓ |
| $T_4$ | A | $x(i)$ | $-u(i)$ | $x(i)=A \cdot u(i)$ | | | | | ↓ |
| $T_5$ | $k_{10}$ | $b_{10}(i-1)$ | $+x(i)$ | D.C | D.C | | $b_{10}(i-1)$ | | ↓ |
| $T_6$ | $k_{10}$ | $y_{10}(i)$ | $-b_{10}(i-1)$ | $y_{10}(i)=x(i)+k_{10} \cdot b_{10}(i-1)$ | | | | | ↓ |
| $T_7$ | $k_9$ | $b_9(i-1)$ | $+y_{10}(i)$ | D.C. | D.C. | | $b_9(i-1)$ | | ↓ |
| $T_8$ | $k_9$ | $y_9(i)$ | $-b_9(i-1)$ | $y_9(i)=y_{10}(i)+k_9 \cdot b_9(i-1)$ | | | | | ↓ |
| $T_9$ | $k_8$ | $b_8(i-1)$ | $+y_9(i)$ | $b_{10}(i)=b_9(i-1)-k_9 \cdot y_9(i)$ | $b_{10}(i)$ | | $b_8(i-1)$ | | ↓ |
| $T_{10}$ | $k_8$ | $y_8(i)$ | $-b_8(i-1)$ | $y_8(i)=y_9(i)+k_8 \cdot b_8(i-1)$ | | | | | ↓ |
| $T_{11}$ | $k_7$ | $y_7(i)$ | $+y_8(i)$ | $b_9(i)=b_8(i-1)-k_8 \cdot y_8(i)$ | $b_9(i)$ | | $b_7(i-1)$ | | ↓ |
| $T_{12}$ | $k_7$ | $y_7(i)$ | $-b_7(i-1)$ | $y_7(i)=y_8(i)+k_7 \cdot b_7(i-1)$ | | | | | ↓ |
| $T_{13}$ | $k_6$ | $b_6(i-1)$ | $+y_7(i)$ | $b_8(i)=b_7(i-1)-k_7 \cdot y_7(i)$ | $b_8(i)$ | | $b_6(i-1)$ | | ↓ |
| $T_{14}$ | $k_6$ | $y_6(i)$ | $-b_6(i-1)$ | $y_6(i)=y_7(i)+k_6 \cdot b_6(i-1)$ | | | | | ↓ |
| $T_{15}$ | $k_5$ | $b_5(i-1)$ | $+y_6(i)$ | $b_7(i)=b_6(i-1)-k_6 \cdot y_6(i)$ | $b_7(i)$ | | $b_5(i-1)$ | | ↓ |
| $T_{16}$ | $k_5$ | $y_5(i)$ | $-b_5(i-1)$ | $y_5(i)=y_6(i)+k_5 \cdot b_5(i-1)$ | | | | | ↓ |
| $T_{17}$ | $k_4$ | $b_4(i-1)$ | $+y_5(i)$ | $b_6(i)=b_5(i-1)-k_5 \cdot y_5(i)$ | $b_6(i)$ | | $b_4(i-1)$ | | ↓ |
| $T_{18}$ | $k_4$ | $y_4(i)$ | $-b_4(i-1)$ | $y_4(i)=y_5(i)+k_4 \cdot b_4(i-1)$ | | | | | ↓ |
| $T_{19}$ | $k_3$ | $b_3(i-1)$ | $+y_4(i)$ | $b_5(i)=b_4(i-1)-k_4 \cdot y_4(i)$ | $b_5(i)$ | | $b_3(i-1)$ | | ↓ |
| $T_{20}$ | $k_3$ | $y_3(i)$ | $-b_3(i-1)$ | $y_3(i)=y_4(i)+K_3 \cdot b_3(i-1)$ | | | | | ↓ |
| $T_{21}$ | $k_2$ | $b_2(i-1)$ | $+y_3(i)$ | $b_4(i)=b_3(i-1)-k_3 \cdot y_3(i)$ | $b_4(i)$ | $b_2(i-1)$ | | | ↓ |
| $T_{22}$ | $k_2$ | $y_2(i)$ | $-b_2(i-1)$ | $y_2(i)=y_3(i)+k_2 \cdot b_2(i-1)$ | | | | | $y_1(i-1)$ |
| $T_1$ | $k_1$ | $b_1(i-1)$ | $+y_2(i)$ | $b_3(i)=b_2(i)-k_2 \cdot y_2(i)$ | $b_3(i)$ | | | $y_1(i-1)$ $\parallel$ $b_1(i-1)$ | $y_1(i-1)$ |

The selector 27 selects the input sound wave signal u(i) at the timing of $T_3$; the eleventh row output $y_1(i-1)=b_1(i-1)$ of the shift register 24 at the timing of $T_1$; the tenth row outputs $b_{10}$, $b_9$, $b_8$, $b_7$, $b_6$, $b_5$, $b_4$ and $b_3$ of the shift register 24 respectively at the timings $T_5$, $T_7$, $T_9$, $T_{11}$, $T_{13}$, $T_{15}$, $T_{17}$ and $T_{19}$; the ninth row output $b_2$ of the shift register 24 at the timing of $T_{21}$; and the outputs $y_1$, $x$, $y_{10}$, $y_9$, $y_8$, $y_7$, $y_6$, $y_5$, $y_4$, $y_3$ and $y_2$ of the adder/subtractor 22 respectively at the timings of $T_2$, $T_4$, $T_6$, $T_8$, $T_{10}$, $T_{12}$, $T_{14}$, $T_{16}$, $T_{18}$, $T_{20}$ and $T_{22}$. The other selector 39 selects, only at the timing of $T_3$, zero, and the output of the shift register 23 at the remaining timings. The selector 39 can be constructed of a two-input AND gate.

The arrangement and method of FIG. 3 has the following advantages compared to those of FIG. 2.

(1) Since the selection of data applied to the first input of the multiplier 21 and the selection of addition and subtraction in the adder/subtractor 22 are both formed in a regular manner with respect to the timing of T, a control signal to be applied to these elements is easily produced.

(2) The arrangement of the selector 39 is simpler than that of the corresponding selector 29 of FIG. 2, while the number of data buses is reduced.

However, since the interval of T is also divided into twenty-two in the arrangement of FIG. 3, the maximum frequency of the clock pulses is required to be 4.84 MHz.

From the above, it will be understood that when a digital filter is actualized in an LSI circuit, which is capable of operating at a high speed, the arrangement of FIG. 3 is advantageous because the area of an LSI chip can be made small. However, when a digital filter is actualized in an LSI circuit, which has less margin for high-speed operation, the arrangement of FIG. 2 is more suitable because it provides freedom in designing the operating process.

Now, it will be described hereinbelow how an arithmetical operation of $$F = E \pm D \times K \qquad (6)$$

which is a fundamental operation in the lattice digital filter of FIGS. 2 and 3, is effected, where the above-formula (6) is represented by the aforementioned formulas (2) and (3). In the above formula (6), each of the values of F, E and D has an accuracy of 16-bit, while the value of K has an accuracy of 10-bit. The arithmetical operation of the above formula (6) is performed in the multiplier 21 and the adder/subtracter 22 of FIGS. 2 and 3, and the operating method therein is a distinctive feature of the digital filter according to the present invention. Namely, since multiplication and addition/subtraction are performed serially, the number of logic circuits constituting the multiplier 21 and the adder/subtractor 22 has been remarkably reduced compared to that in the case of the conventional parallel operating technique. Although the maximum frequency of the clock pulses for effecting the operations has to be as high as 4.4 to 4.84 MHz as described in the above, a frequency value of 5 MHz or so is practical in microcomputers on the market in view of recent LSI technique.

The arithmetical operation of formula (6) is actualized with timings shown in a timing chart of FIG. 4. One input of the multiplier 21 is an input serial data D ($d_0$ to $d_{15}$) of formula (6), having 16-bit accuracy, and the other input is a parallel input K having 10-bit accuracy. Each bit of K is continuously applied to the multiplier 21 for an interval of a single timing of T, and the respective values of D ($d_0$ to $d_{15}$) are multiplied by the value of K in a sequence. Namely, at first $d_0$, which is a least significant bit (LSB) of D, is applied to the multiplier 21 to be multiplied by K, then $d_1$ is applied at the timing of $S_2$ to the multiplier 21 to be multiplied by K. In this way, all the values of D are respectively multiplied by K. Then upper sixteen bits $P_0$ to $P_{15}$ of the product P of the multiplication will be emitted in a sequence to be applied to the first input of the adder/subtractor 22 from the timing of $S_{21}$ in an order starting from $P_0$, i.e. the least significant bit (LSB) of the product P. On the other hand, the second input of the adder/subtractor 22 receives the other input E $e_0, e_1, e_3 \ldots e_{15}$) from the shift register 23 from the timing of $S_{22}$ one after another. The output data P of the multiplier 21 are also applied to the first input of the adder/subtractor 22 in a sequence in synchronism with the timing of the application of the data E. The result F ($f_0, f_1, f_2 \ldots f_{15}$) of addition/subtraction will be emitted in a sequence from the timing of $S_1$ of next T. The above-described operations are repeated to actualize filtering operation.

Next, the way of multiplication expressed in terms of $D \times K$ will be described hereinafter, where values are respectively represented by 2s complements. D and K will be mathematically expressed by:

$$D = -d_{15} \cdot 2^{15} + \sum_{i=0}^{14} d_i \cdot 2^i \quad (7)$$

$$K = -K_9 \cdot 2^9 + \sum_{j=0}^{8} K_j \cdot 2^j \quad (8)$$

When expanding the product D·K so as to be able to operate serially, the following formula (9) will be obtained.

$$\begin{aligned}
D \cdot K = & K_0 \sum_{i=0}^{14} d_i \cdot 2^i + \overline{K}_0 \cdot d_{15} \cdot 2^{15} \quad \text{(PPD1)} \\
& + K_1 \sum_{i=0}^{14} d_i \cdot 2^{i+1} + \overline{K}_1 \cdot d_{15} \cdot 2^{16} \quad \text{(PPD2)} \\
& + K_2 \sum_{i=0}^{14} d_i \cdot 2^{i+2} + \overline{K}_2 \cdot d_{15} \cdot 2^{17} \quad \text{(PPD3)} \\
& \vdots \\
& + K_8 \sum_{i=0}^{14} d_i \cdot 2^{i+8} + \overline{K}_8 \cdot d_{15} \cdot 2^{23} \quad \text{(PPD9)} \\
& + K_9 \sum_{i=0}^{14} \overline{d}_i \cdot 2^{i+9} + K_9 \cdot 2^9 \quad \text{(PPD10)} \\
& - (d_{15} + k_9 - d_{15} \cdot K_9) 2^{24} + d_{15} \cdot 2^{15} \quad \text{(CT)}
\end{aligned} \quad (9)$$

Formula (9) comprises eleven partial products PPD1 to PPD10 and CT, and these partial products will be serially added to each other by ten full adders so that an objective product will be finally obtained.

Figure 5:
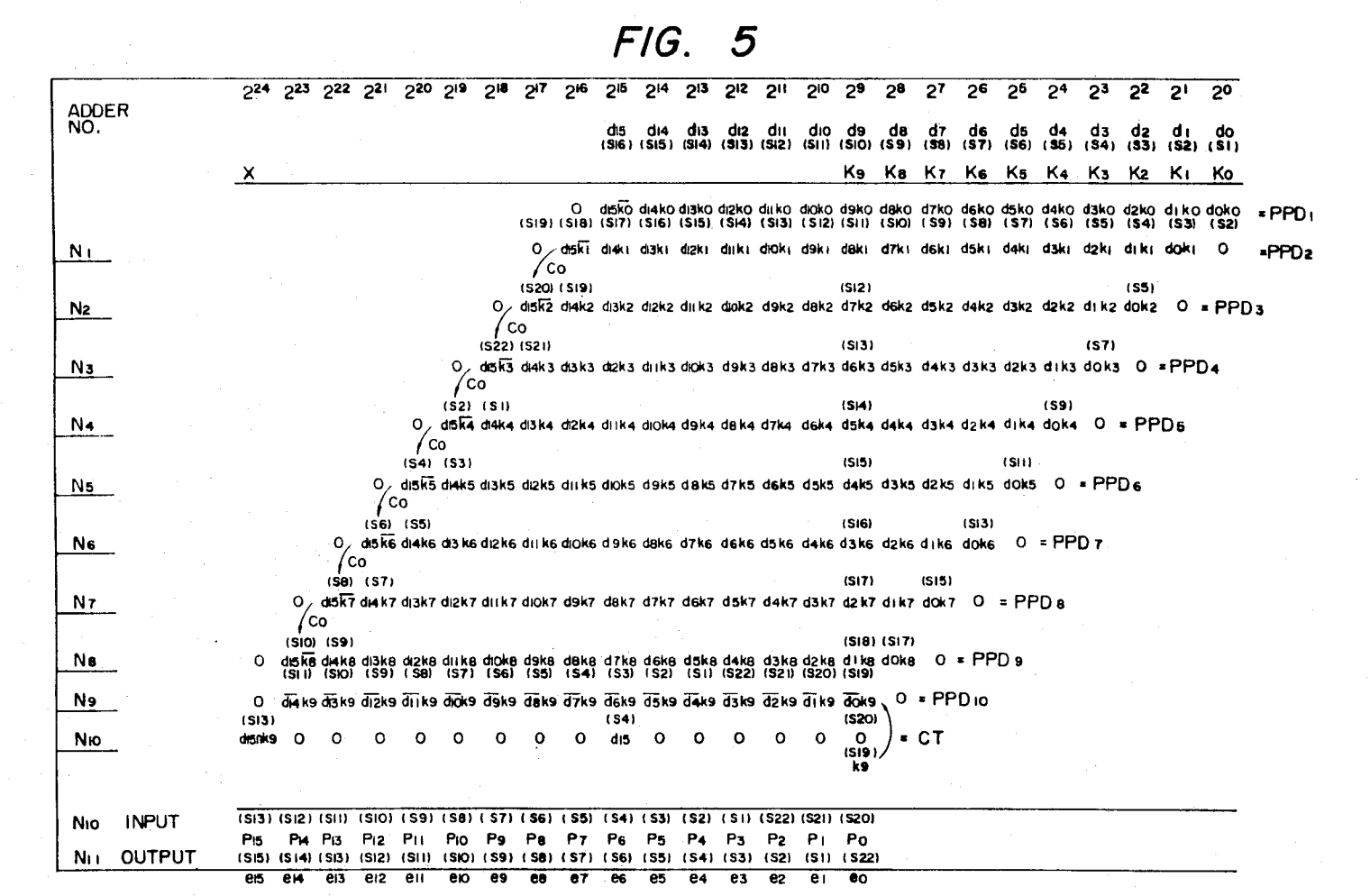

FIG. 5 is a schematic table for showing the operations represented by formula (9), and the first partial product of the first row of formula (9) corresponds to the partial product of the first row of the table of FIG. 5; and in the same manner, other rows of formula (9) respectively correspond to other rows of the table of FIG. 5 one by one. The first partial product PPD1 of the first row is added to the second partial product PPD2 of the second row by a first adder $N_1$, which functions as an adder, and then the third partial product PPD3 of the third row is added serially by a second adder $N_2$ to a partial sum already obtained to obtain another partial sum. This operation of addition is continued until a tenth adder $N_{10}$, so that the output of the tenth adder $N_{10}$ will be obtained as the objective product D·K. In FIG. 5, references $S_1, S_2, S_3 \ldots$ indicate the timings of the additions effected by the adders $N_1$ to $N_{10}$.

Figure 6:
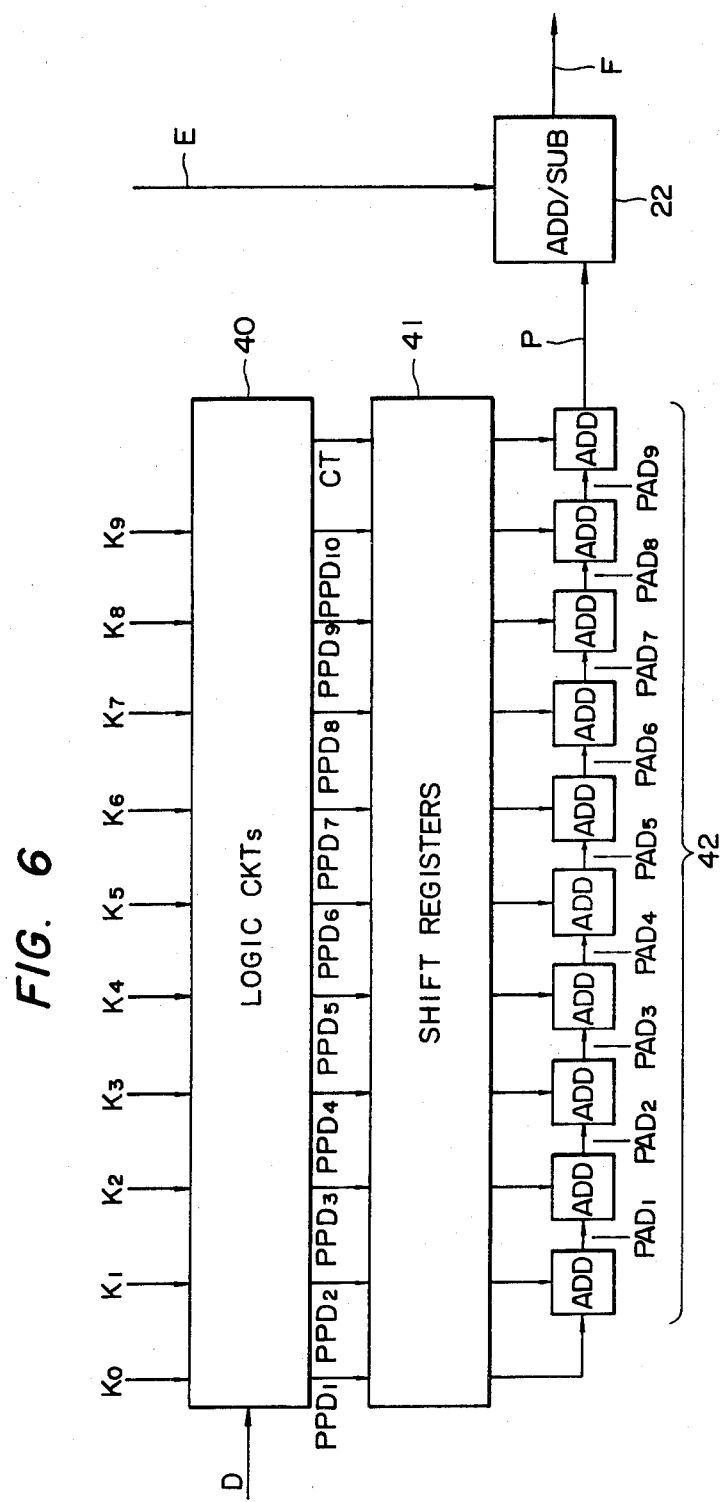
FIG. 6 is a view showing the detailed structure of the multiplier of FIG. 2 or FIG. 3 for performing the basic operation of FIG. 4.

FIG. 6 shows a block diagram for executing the above-mentioned operations. Namely, the circuit of FIG. 6 corresponds to the combination of the multiplier 21 and the adder/subtractor 22 of FIGS. 2 and 3. A block 40 is a circuit for emitting serially the partial products PPD1 to PPD10 and CT of the respective rows of formula (9) from its LSB. In detail, the block 40 comprises 10 logic circuits in total, where each logic circuit is provided for each K. Each of the logic circuits consists of two 3-input AND gates, an OR gate and an inverter. The three input terminals of the AND gates are respectively responsive to K or $\overline{K}$, d or d, and a clock pulse signal (not shown). The inverted signals $\overline{K}$ and $\overline{d}$ are respectively produced by the respective inverters of respective logic circuits. A block 41 is a circuit having shift registers so that the partial products PPD1 to PPD10 and CT from the block 40 are retarded to effect additions at the timings shown in FIG. 5. Each of blocks 42 is an adder comprising ten 1-bit full adders, a first shift register for retarding a single carry, and a second shift register for retarding the result of addition by one timing. If labelling the adders 42 as $N_1, N_2, N_3$ and so on from the left, the adders 42 correspond to FIG. 5. The above-mentioned partial sums are respectively indicated by PAD 1 to PAD 9. The adder/subtractor 22 responsive to first and second data P and E comprises a 1-bit full adder, a first shift register for storing a single carry, and a second shift register for storing the result of addition. In order to perform subtraction, the first input signal P of the adder/subtractor 22 will be inverted, and logic "1" will be set in the first shift register, in which a carry has been stored in advance, so that a value "1" will be added. The adder/subtractor 22 is arranged to emit a value F in the form of 2s complement from its LSB with sixteen timings, i.e. from $S_1$ to $S_{16}$.

Comparing the present invention, which has adopted the above-described serial operating technique for the operations in a digital filter, with the conventional digital filters, it will be understood that there is a substantial difference between the ways of operations because in the conventional technique, a pipeline multiplier is used for effecting parallel operations, and therefore, when operating the above-described formulas (1) to (5), formula (2) is calculated from n=10 to n=1, and then formula (3) is calculated from n=9 to n=1 to obtain a single output signal. Moreover, in the conventional method, 16-bit data are multiplied by 10-bit data in the pipeline multiplier, and therefore, sixty-four (16 bits×4 rows) full adders are required even though second order Booth's algorithm is adopted, while another sixteen full adders are required for an adder/subtractor which follows the pipeline multiplier. Namely, the conventional operating method requires a total of eighty full adders in contrast to the present invention which requires only eleven full adders for performing the same operations. Consequently, the present invention provides an effective technique for reducing the size of an integrated circuit for actualizing a digital filter.

The above-described embodiments are just examples of the present invention, and therefore, it will be understood for those skilled in the art that many modifications and variations may be made without departing from the spirit of the present invention.

What is claimed is:

1. A digital filter for filtering a digital exciting input signal by modifying the digital exciting input signal with various parameters, comprising:
   (a) means for storing a plurality of filter factors applied as said various parameters;
   (b) a serial multiplier having a set of first inputs responsive to the output data of said storing means, a second input and an output;
   (c) an adder/subtractor having a first input responsive to the output data of said multiplier, a second input and an output;
   (d) a first delay circuit for retarding the output data of said adder/subtractor;
   (e) latch means for temporarily storing the output data of said first delay circuit so as to effect series/parallel conversion;
   (f) a first selecting means for selecting one of the following circuits: the first delay output; the adder/subtractor output; or said digital exciting input signal; so that selected data are fed to said second input of said multiplier;
   (g) a second delay circuit for retarding the output data of said first selecting means; and
   (h) a second selecting means for selectively applying the output data of said second delay circuit to said second input of said adder/subtractor;
   said serial multiplier, said adder/subtractor, said first and second delay circuits, said latch, said first and second selecting means being all arranged such that data transmission from said first selector to said second input of said serial multiplier and to said second delay circuit, from said second delay circuit to said second selecting means, from said serial multiplier to said first input of said adder/subtractor, from said second selecting means to said second input of said adder/subtractor, from said adder/subtractor to said first delay circuit, from said first delay circuit to said first selecting means, and from said first delay circuit to said latch means are all effected serially.

2. A digital filter as claimed in claim 1, wherein said second selecting means is arranged to select one of said output data of said second delay circuit and said output data of said adder/subtractor so that selected data are applied to said second input of said adder/subtractor.

3. A digital filter as claimed in claim 1, wherein said storing means comprises a shift register having a plurality of rows.

4. A digital filter as claimed in claim 1, wherein said multiplier comprises:
   (a) a circuit for emitting, in parallel, partial products PPD1 to PPD10 and CT all represented by the respective rows of the following formula from least significant bit of each of said partial products:

$$D \cdot K = K_0 \sum_{i=0}^{14} d_i \cdot 2^i + \overline{K}_0 \cdot d_{15} \cdot 2^{15} \quad \text{(PPD1)}$$

$$+ K_1 \sum_{i=0}^{14} d_i \cdot 2^{i+1} + \overline{K}_1 \cdot d_{15} \cdot 2^{16} \quad \text{(PPD2)}$$

$$+ K_2 \sum_{i=0}^{14} d_i \cdot 2^{i+2} + \overline{K}_2 \cdot d_{15} \cdot 2^{17} \quad \text{(PPD3)}$$

$$\vdots$$

$$+ K_8 \sum_{i=0}^{14} d_i \cdot 2^{i+8} + \overline{K}_8 \cdot d_{15} \cdot 2^{23} \quad \text{(PPD9)}$$

-continued $$+ K_9 \sum_{i=0}^{14} \overline{d}_i \cdot 2^{i+9} + K_9 \cdot 2^9 \quad \text{(PPD10)}$$

$$- (d_{15} + k_9 - d_{15} \cdot K_9) 2^{24} + d_{15} \cdot 2^{15} \quad \text{(CT)}$$

wherein D indicates a serial input data of 16 bits; and K indicates a parallel input data of 10 bits respectively expressed by:

$$D = -d_{15} \cdot 2^{15} + \sum_{i=0}^{14} d_i \cdot 2^i$$

$$K = -K_9 \cdot 2^9 + \sum_{j=0}^{8} K_j \cdot 2^j$$

(b) a circuit having shift registers for retarding said partial products from said first mentioned circuit; and
   (c) ten circuits each having ten 1-bit full adders, a first shift register for retarding a single carry, and a second shift register for retarding the result of addition.

5. Apparatus for synthesizing vocal sounds by linear prediction code technique, comprising:
   (a) a voiced sound source arranged to change the pitch of its output signal in accordance with a signal indicative of pitch;
   (b) a voiceless sound source;
   (c) a digital filter having
   means for storing a plurality of filter factors applied as said various parameters;
   a serial multiplier having a set of first inputs responsive to the output data of said storing means, a second input and an output;
   an adder/subtractor having a first input responsive to the output data of said multiplier, a second input and an output;
   a first delay circuit for retarding the output data of said adder/subtractor;
   latch means for temporarily storing the output data of said first delay circuit so as to effect series/parallel conversion;
   a first selecting means for selecting one of the following circuits: the first delay output; the adder/subtractor output; or said digital exciting input signal; so that selected data are fed to said second input of said multiplier;
   a second delay circuit for retarding the output data of said first selecting means; and
   a second selecting means for selectively applying the output data of said second delay circuit to said second input of said adder/subtractor;
   said serial multiplier, said adder/subtractor, said first and second delay circuits, said latch, said first and second selecting means being all arranged such that data transmission from said first selector to said second input of said serial multiplier and to said second delay circuit, from said second delay circuit to said second selecting means, from said serial multiplier to said first input of said adder/subtractor, from said second selecting means to said second input of said adder/subtractor, from said adder/subtractor to said first delay circuit, from said first delay circuit to said first selecting means, and from said first delay circuit to said latch means are all effected serially; and (d) a digital-to-analog converter responsive to the output signal of said digital filter.

6. Apparatus for synthesizing vocal sounds as claimed in claim 5, wherein said second selecting means of said digital filter is arranged to select one of said output data of said second delay circuit and said output data of said adder/subtractor so that selected data are applied to said second input of said adder/subtractor.

7. Apparatus for synthesizing vocal sounds as claimed in claim 5, further comprising an amplifier and a low pass filter responsive to the output signal of said digital-to-analog converter for driving a speaker.

* * * * *